US012626859B2

(12) United States Patent
Ortiz

(10) Patent No.: US 12,626,859 B2
(45) Date of Patent: May 12, 2026

(54) DISTRIBUTION TRANSFORMER SYSTEM AND METHODS THEREOF

(71) Applicant: Ubicquia, Inc., Fort Lauderdale, FL (US)

(72) Inventor: Jow H. Ortiz, Coral Springs, FL (US)

(73) Assignee: Ubicquia, Inc., Fort Lauderdale, FL (US)

( * ) Notice: Subject to any disclaimer, the term of this patent is extended or adjusted under 35 U.S.C. 154(b) by 262 days.

(21) Appl. No.: 18/091,667

(22) Filed: Dec. 30, 2022

(65) Prior Publication Data

US 2023/0144327 A1 May 11, 2023

Related U.S. Application Data

(63) Continuation of application No. 16/987,300, filed on Aug. 6, 2020, now Pat. No. 11,551,858.

(Continued)

(51) Int. Cl.
| | |
|---|---|
| *H01F 27/40* | (2006.01) |
| *G01R 31/62* | (2020.01) |
| *H01F 27/06* | (2006.01) |

(52) U.S. Cl.
CPC .......... *H01F 27/402* (2013.01); *G01R 31/62* (2020.01); *H01F 27/06* (2013.01); *H01F 2027/404* (2013.01); *H01F 2027/406* (2013.01)

(58) Field of Classification Search
CPC ......... H01F 2027/404; H01F 2027/406; H01F 27/06; H01F 27/402; G01R 31/62

(Continued)

(56) References Cited

U.S. PATENT DOCUMENTS

| | | | |
|---|---|---|---|
| 2,066,935 | A | 1/1937 | Hodnette |
| 3,035,802 | A | 5/1962 | Wyman et al. |

(Continued)

FOREIGN PATENT DOCUMENTS

WO 2021011918 A1 1/2021

OTHER PUBLICATIONS

Third Party SubmissionUnder 37 CFR 1.290 (Year: 2024).*

(Continued)

*Primary Examiner* — Yemane Mehari
(74) *Attorney, Agent, or Firm* — Daniel C. Crilly

(57) ABSTRACT

A distribution transformer system includes a distribution transformer and a distribution transformer monitoring (DTM) device secured to the transformer. The DTM device includes multiple sensors, a controller, and a communication interface. The sensors are configured to monitor physical properties of the distribution transformer. Each of the sensors outputs respective sensor data representative of at least one monitored physical property of the distribution transformer. The controller is configured to receive the respective sensor data from each sensor to produce received sensor data. The communications interface is in communication with the controller and configured to communicate the received sensor data to a remote system for use in determining operational parameters of the distribution transformer. In one embodiment, the distribution transformer system further includes a surge arrester associated with the distribution transformer and the DTM device includes a surge arrester sensor configured to monitor the surge arrester and output surge arrester sensor data.

11 Claims, 10 Drawing Sheets

Related U.S. Application Data

(60) Provisional application No. 62/885,216, filed on Aug. 10, 2019.

(58) Field of Classification Search
USPC .......................................................... 361/35
See application file for complete search history.

(56) References Cited

U.S. PATENT DOCUMENTS

| | | | |
|---|---|---|---|
| 3,462,645 | A | 8/1969 | Leonard |
| 3,739,226 | A | 6/1973 | Seiter et al. |
| 3,772,624 | A | 11/1973 | Keogh |
| 5,131,283 | A | 7/1992 | Canfield |
| 6,147,581 | A | 11/2000 | Rancourt et al. |
| 6,711,512 | B2 | 3/2004 | Noh |
| 6,914,195 | B2 | 7/2005 | Archambault et al. |
| 7,548,054 | B2 | 6/2009 | Tan et al. |
| 7,701,357 | B2 | 4/2010 | Deaver, Sr. et al. |
| 7,834,736 | B1 | 11/2010 | Johnson et al. |
| 8,013,702 | B2 | 9/2011 | Haj-Maharsi et al. |
| 8,174,268 | B2 | 5/2012 | Bose et al. |
| 8,400,320 | B2 | 3/2013 | Santos |
| 8,461,823 | B2 | 6/2013 | de Buda |
| 8,824,109 | B2 | 9/2014 | Ciesielski et al. |
| 9,500,716 | B2 * | 11/2016 | Turner ................... G01N 31/02 |
| 10,014,791 | B2 | 7/2018 | Bala |
| 10,209,288 | B2 | 2/2019 | Turner |
| 10,259,634 | B2 | 4/2019 | Bennett |
| 10,761,147 | B2 † | 9/2020 | Beaudet |
| 11,328,862 | B1 | 5/2022 | Hutson |

| | | | |
|---|---|---|---|
| 2006/0251147 | A1 | 11/2006 | Balan |
| 2010/0315190 | A1 | 12/2010 | Haj-Maharsi et al. |
| 2011/0257924 | A1 | 10/2011 | Bryant et al. |
| 2013/0158897 | A1 | 6/2013 | Jain |
| 2014/0176336 | A1 * | 6/2014 | Li ........................... G01R 31/52 |
| | | | 340/870.01 |
| 2015/0276890 | A1 | 10/2015 | Turner et al. |
| 2016/0203694 | A1 | 7/2016 | Hogasten et al. |
| 2017/0011612 | A1 * | 1/2017 | Jain ..................... G08B 21/182 |
| 2018/0252758 | A1 * | 9/2018 | Turner .................. G01R 19/25 |
| 2018/0364874 | A1 * | 12/2018 | Herlong, II ....... H02J 13/00034 |
| 2019/0378648 | A1 * | 12/2019 | Pratt ..................... H01F 27/402 |
| 2020/0393521 | A1 * | 12/2020 | Bayoumi ............... G01D 21/02 |
| 2021/0043373 | A1 | 2/2021 | Ortiz et al. |

OTHER PUBLICATIONS

Hubbell Power Systems, Inc., "Surge Arresters IEC Line Discharge Classes 2, 3, 4 & 5", Feb. 2015, 17 pages, Hubbell/Ohio Brass, Aiken, South Carolina, USA.

Arresterworks.com, "What is a Lightning Arrester?", http://www.arresterworks.com/ArresterFacts_files/ArresterFacts%20009%20What%20is%20an%20Arrester%20R3.pdf, Rev. 6, Aug. 2016, 18 pages.

"Transformer IQ User Manual r5.0," GridSense Inc., published Feb. 6, 2012, 120 pages ("Transformer").†

"ABB Ability Wireless Monitor for Surge Arrester: Enabling reliability and availability of power supply," ABB Switzerland Ltd., published Mar. 26, 2019, 12 pages ("ABB").†

\* cited by examiner
† cited by third party

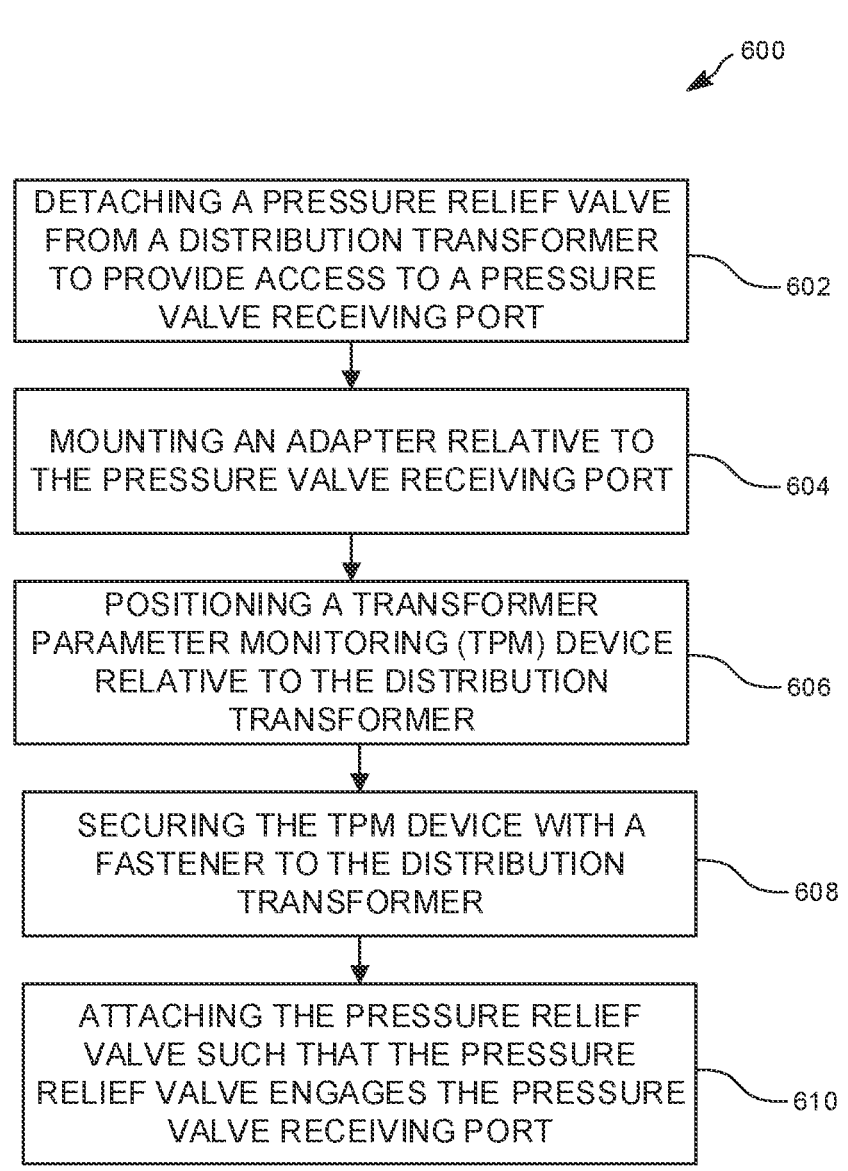

600

DETACHING A PRESSURE RELIEF VALVE
FROM A DISTRIBUTION TRANSFORMER
TO PROVIDE ACCESS TO A PRESSURE
VALVE RECEIVING PORT
— 602

MOUNTING AN ADAPTER RELATIVE TO
THE PRESSURE VALVE RECEIVING PORT
— 604

POSITIONING A TRANSFORMER
PARAMETER MONITORING (TPM) DEVICE
RELATIVE TO THE DISTRIBUTION
TRANSFORMER
— 606

SECURING THE TPM DEVICE WITH A
FASTENER TO THE DISTRIBUTION
TRANSFORMER
— 608

ATTACHING THE PRESSURE RELIEF
VALVE SUCH THAT THE PRESSURE
RELIEF VALVE ENGAGES THE PRESSURE
VALVE RECEIVING PORT
— 610

FIG. 6

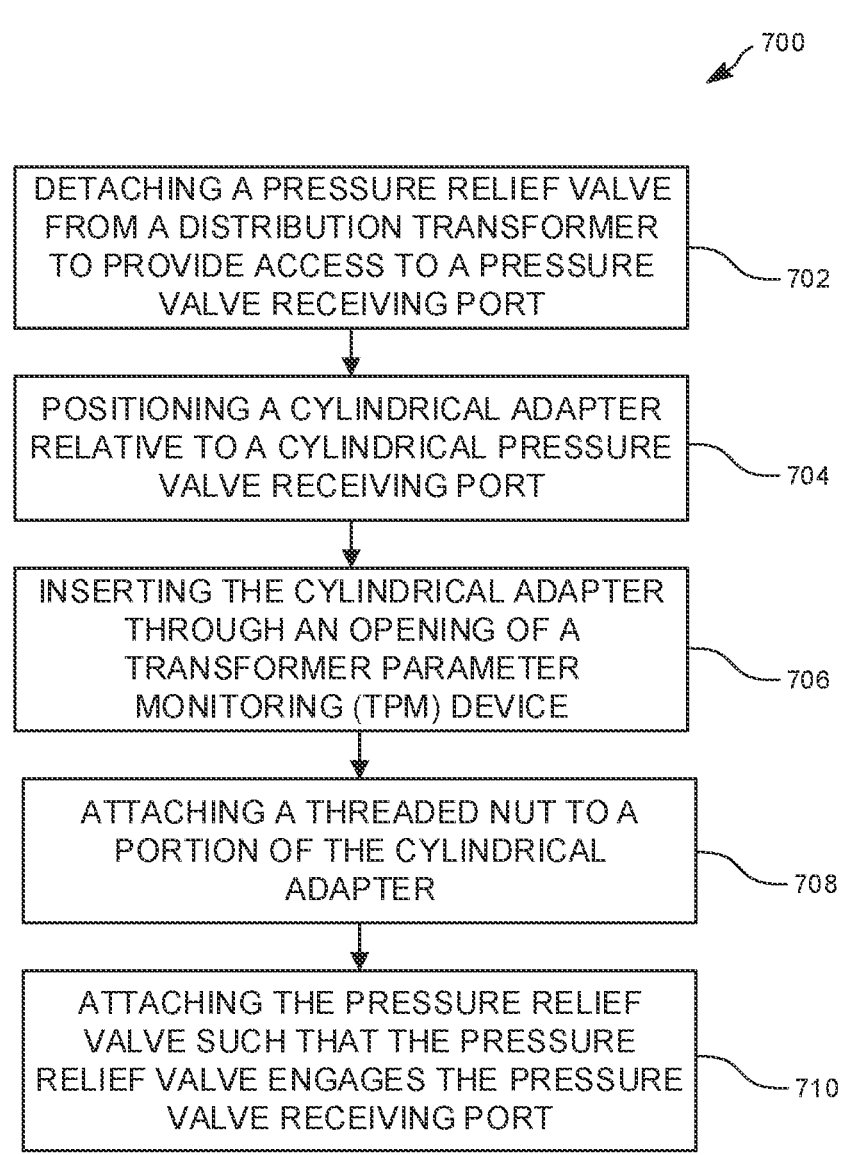

700

DETACHING A PRESSURE RELIEF VALVE
FROM A DISTRIBUTION TRANSFORMER
TO PROVIDE ACCESS TO A PRESSURE
VALVE RECEIVING PORT — 702

POSITIONING A CYLINDRICAL ADAPTER
RELATIVE TO A CYLINDRICAL PRESSURE
VALVE RECEIVING PORT — 704

INSERTING THE CYLINDRICAL ADAPTER
THROUGH AN OPENING OF A
TRANSFORMER PARAMETER
MONITORING (TPM) DEVICE — 706

ATTACHING A THREADED NUT TO A
PORTION OF THE CYLINDRICAL
ADAPTER — 708

ATTACHING THE PRESSURE RELIEF
VALVE SUCH THAT THE PRESSURE
RELIEF VALVE ENGAGES THE PRESSURE
VALVE RECEIVING PORT — 710

FIG. 7

DISTRIBUTION TRANSFORMER SYSTEM AND METHODS THEREOF

CROSS-REFERENCE TO RELATED APPLICATIONS

The present application is a continuation of U.S. application Ser. No. 16/987,300, which was filed on Aug. 6, 2020, now U.S. Pat. No. 11,551,858, and is incorporated herein by reference in its entirety. U.S. application Ser. No. 16/987,300 claims priority upon and the benefit of U.S. Provisional Application No. 62/885,216, which was filed on Aug. 10, 2019, and is incorporated herein by reference in its entirety.

TECHNICAL FIELD

This disclosure relates to distribution transformers. More particularly, this disclosure relates to monitoring operational parameters of a distribution transformer and an associated surge arrester, and methods of retrofitting the distribution transformer.

BACKGROUND

Distribution transformers provide a last voltage transformation in an electrical power distribution system by stepping down a voltage used in a distribution line to a voltage that is suitable for use by a consumer. For example, a distribution transformer may step down distribution line voltage to household voltage levels for distribution to one or more consumers (e.g., residences, facilities, etc.). Distribution transformers can be pole-mounted to a utility pole or pad-mounted on the ground. Pole mounted style transformers are often installed with surge arresters.

SUMMARY

This disclosure relates to monitoring operational parameters of a distribution transformer and an associated surge arrester and methods of retrofitting the distribution transformer.

In an example, a transformer parameter monitoring (TPM) device can include a plurality of sensors. A subset of the plurality of sensors can be configured to monitor one or more physical properties of a distribution transformer, and another subset of the plurality of sensors can be configured to monitor a surge arrester associated with the distribution transformer. The TPM device can further include a controller that can be configured to receive captured sensor data from the plurality of sensors, and a communications interface that can be configured to receive the captured sensor data and communicate the captured sensor data to a remote system for evaluation thereof to determine one or more operational parameters of the distribution transformer and an amount of deterioration of the surge arrester.

In another example, a method for retrofitting a distribution transformer can include detaching a pressure relief device from the distribution transformer to provide access to a pressure valve receiving port, mounting an adapter relative to the pressure valve receiving port, such that the adapter surrounds the pressure valve receiving port, positioning a TPM device relative to the distribution transformer, such that the adapter extends through an opening of the TPM device to support the TPM device, securing the TPM device with a fastener to the distribution transformer to rigidly fix the TPM device to the distribution transformer, and attaching the pressure relief device, such that a portion of the pressure relief device extends through the fastener and the opening of TPM device to engage the pressure valve receiving port.

In a further example, a method can include positioning a mounting bracket relative to at least one arrester nut of a distribution transformer, such that the at least one arrester nut protrudes away from the distribution transformer through an opening of the mounting bracket. The method can further include aligning the mounting bracket, such that an upper portion of the mounting bracket is positioned a distance above an oil fill hole of the distribution transformer while the at least one arrester nut protrudes through the opening of the mounting bracket. The method can further include securing the mounting bracket to the distribution transformer via a mounting bracket securing device and securing a TPM device to the mounting bracket to secure the TPM device to the distribution transformer to enable the TPM device to measure one or more physical properties of the distribution transformer.

BRIEF DESCRIPTION OF THE DRAWINGS

FIG. 6 is a flow diagram depicting an example of a method for retrofitting a distribution transformer with a TPM device.

FIG. 7 is a flow diagram depicting another example of a method for retrofitting a distribution transformer with a TPM device.

DETAILED DESCRIPTION

Figure 1:
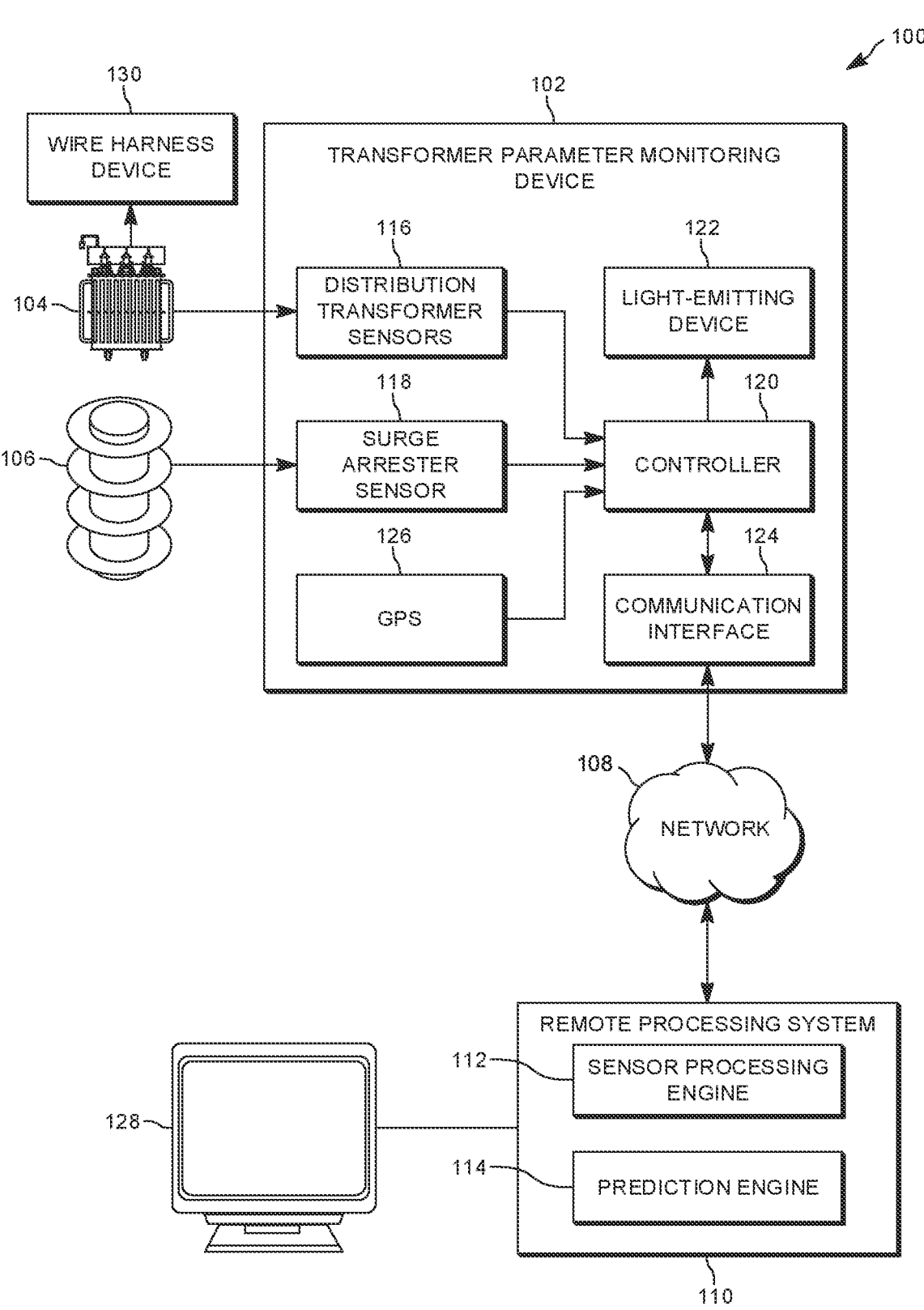
FIG. 1 is an example environment that includes a TPM device.

This disclosure relates to monitoring operational parameters of a distribution transformer and an associated surge arrester and methods of retrofitting the distribution transformer. In some examples, a distribution transformer can be retrofitted with a TPM device. The TPM device can be configured to monitor one or more operational parameters of the distribution transformer and communicate with a remote processing system for processing of sensor data characterizing the one or more operational parameters of the distribution transformer. The remote processing system can be configured to evaluate the sensor data relative to a corresponding parameter threshold to determine whether the one or more operational parameters of the distribution transformer are acceptable. In some examples, the remote processing system can be configured to determine that the one or more operational parameters are not acceptable and notify (e.g., alert) personnel that appropriate action or measures are needed to be taken to minimize a transformer failure.

In some examples, the remote processing system can be configured to process the sensor data and employ machine learning methods to predict transformer failures. By predicting when the distribution transformer is likely to experience a failure, the system can improve the overall maintenance or performance of the distribution transformer and improve the response time of personnel in scenarios of complete transformer failure. In some examples, the remote processing system can be configured to apply the machine learning methods to surge arrester sensor data generated by a surge arrester sensor to predict and/or alert on surge arrester failures.

In some examples, to retrofit the distribution transformer with the TPM device, a pressure relief valve of the distribution transformer can be detached to provide access to a pressure valve receiving port. An adapter can be mounted to the pressure valve receiving port and the TPM device can be configured such that the adapter extends through an opening of a housing of the TPM device to support the TPM device. The housing of the TPM device can be secured with a fastener to the distribution transformer to rigidly fix the TPM device to the distribution transformer. The pressure relief valve can be attached, such that a portion of the pressure relief valve extends through the fastener and the opening of the TPM device to engage the pressure valve receiving port.

In some examples, to retrofit the distribution transformer with the TPM device, a mounting bracket can be positioned relative to at least one arrester nut of the distribution transformer, such that the at least one arrester nut protrudes away from the distribution transformer through a slot opening (e.g., a mounting slot) of the mounting bracket. The mounting bracket can be aligned (e.g., slid up and/or down), such that an upper portion of the mounting bracket is positioned a distance above an oil fill hole of the distribution transformer. The mounting bracket can be secured to the distribution transformer via at least one bolt. The TPM device can be secured to the mounting bracket to enable the TPM device to detect an oil level of oil inside the distribution transformer.

Accordingly, the distribution transformer can be retrofitted with the TPM device without requiring replacement or extensive modification of the distribution transformer, such that the oil level inside the distribution transformer can be monitored (e.g., externally monitored). The retrofitting techniques described herein do not require removal of the distribution transformer from a corresponding mounting (e.g., from a pole) or disconnecting the distribution transformer from a power source (e.g., a distribution line, as power can be switched remotely). Moreover, in some examples, the distribution transformer can remain operational during the retrofitting process.

FIG. 1 is an example environment 100 that includes a TPM device 102. The TPM device 102 can be employed to retrofit a distribution transformer 104 to allow for remote monitoring of one or more transformer operational parameters, as described herein. In some examples, the TPM device 102 can be configured to monitor an arrester operational parameter of a surge arrester 106 to determine a health (e.g., integrity) of the surge arrester 106, which can be configured to protect the distribution transformer 104. In some examples, the distribution transformer 104 can correspond to a pole-mounted distribution transformer, a pad-mounted distribution transformer, or a vault distribution transformer. The distribution transformer 104, in some examples, can be a single-phase distribution transformer, and in other examples, can be a three-phase distribution transformer.

The TPM device 102 can be configured to communicate over a network 108 with a remote processing system 110. The network 108 can include a wireless local area network (WLAN), a cellular network, a mesh network, a wired network, or a combination thereof. The remote processing system 110 can correspond to a cloud computing environment and can include one or more servers or computing systems. In some examples, the remote processing system 110 can include one or more processors and a memory. The memory can include one or more non-transitory computer-readable media having instructions and data stored thereon, such as a sensor processing engine 112 and a prediction engine 114.

In some examples, the sensor processing engine 112 and/or the prediction engine 114 can be implemented on one or more physical devices (e.g., servers) that can reside in a cloud computing environment, a mobile device, or on a computer, such as a laptop computer, a desktop computer, a tablet computer, a workstation, server, or the like. In the present example, although the sensor processing engine 112 and the prediction engine 114 are illustrated as being implemented in a single system implementation, in other examples, these components could be distributed across different systems and communicate, for example, over a wireless and/or wired network. The sensor processing engine 112 can be configured to evaluate sensor data to determine whether one or more operational parameters of the distribution transformer 104 are acceptable. The prediction engine 114, as described herein, can be configured to predict a future maintenance of the distribution transformer 104. Thus, the prediction engine 114 can be configured to assess the working condition of the distribution transformer 104, diagnose faults, and estimate when (e.g., identify a particular date, a range of dates, a specific year, or a time frame) transformer failure is likely to occur.

In some examples, the TPM device 102 includes distribution transformer sensors 116 and a surge arrester sensor 118. The distribution transformer sensors 116 can be configured to monitor one or more physical properties of the distribution transformer 104 and the surge arrester sensor 118 can be configured to monitor a physical property of the surge arrester 106. In some examples, the surge arrester sensor 118 can correspond to a surge arrester integrity monitor. Although FIG. 1 illustrates the distribution transformer sensors 116 and the surge arrester sensors 118 as located within the TPM device 102, it is to be understood that each respective sensor 116 and 118 can be positioned in proximity of the distribution transformer 104 and/or the surge arrester 106 to enable monitoring of a respective condition or physical property of the distribution transformer 104 and/or the surge arrester 106. Thus, in some examples, at least some of the sensors 116 and 118 can be located outside the TPM device 102 and can be coupled via wires and/or a wire harness to the TPM device 102 to provide corresponding sensor data, such as to the controller 120.

In some examples, the distribution transformer sensors 116 can include a combination of an oil temperature sensor for measuring a temperature of oil in an oil tank of the distribution transformer 104, a tank temperature sensor for measuring a temperature of the oil tank of the distribution transformer 104, an oil level sensor for measuring an amount of oil in the oil tank, a pressure tank sensor for measuring a pressure inside the oil tank, an ambient temperature sensor for measuring an ambient temperature outside the distribution transformer 104, a thermocouple sensor for measuring a temperature of primary and secondary side terminations of the distribution transformer 104, a Rogowski style current transformer (CT) coil for measuring a current flow to a load coupled to the distribution transformer 104, a current sensor for measuring an amount of current being outputted by the distribution transformer 104, and a motion sensor.

In some examples, the motion sensor can be configured to detect one of a movement of a transformer from an initial vertical installation (angle due to pole leaning or support hardware become loose or damaged over time or sudden movement due to shock (e.g., when a vehicle strikes a power pole)) of the distribution transformer 104, a vibration of the distribution transformer 104 (e.g., when lines "gallop" or begin to have harmonic oscillations) and a movement of a mounting mechanism for the distribution transformer 104. The mounting mechanism for the distribution transformer 104 can correspond to one of a pole, a concrete pad, and a platform.

In some examples, the TPM device 102 can include a controller 120. The controller 120 can be configured (e.g., as hardware and/or software) to implement communication of data (e.g., sensor data) to the remote processing system 110 and actuation of a light-emitting device 122. In some examples, the controller 120 can be configured to evaluate the sensor data and actuate the light-emitting device 122 based on the evaluation. The controller 120 can be in communication with the distribution transformer sensors 116 and the surge arrester sensor 118 to receive the sensor data. In some examples, the controller 120 can include asset information. The asset information can be stored in a memory of the controller 120 and can uniquely identify the distribution transformer 104. In some examples, the TPM device 102 includes memory separate of the memory of the controller 120 and can be employed to store the asset information.

The controller 120 can be configured to provide the sensor data generated by each of the distribution transformer and surge arrester sensors 116 and 118 and in some examples the asset information to a communications interface 124. The communications interface 124 can be configured to communicate the sensor data and the asset information to the remote processing system 110 for evaluation thereof to determine the one or more operational parameters of the distribution transformer 104 and/or an amount of deterioration of the surge arrester 106. In some examples, the communications interface 124 can be one of a wireless interface, a wired interface, or a combination thereof. The communications interface 124 can be configured to transmit the sensor data and additional data (e.g., the asset information) over one of a wireless local area network (WLAN), a cellular network (e.g., Long-Term Evolution (LTE) network, a fifth generation (5G) network, etc.), a mesh network or a combination thereof to the remote processing system 110.

In some examples, the TPM device 102 can include a global positioning system (GPS) 126. The GPS 126 can be configured to provide location information for the distribution transformer 104. The controller 120 can be configured to communicate the location information to the remote processing system 110 via the communications interface 124. The TPM device 102 can further include the light-emitting device 122 (e.g., a light-emitting diode (LED)). The light-emitting device 122 can be actuated to emit light (e.g., a red light) by the controller 120, for example, in response to a pressure sensor signal from the pressure tank sensor characterizing the pressure inside the tank being equal to or greater than a pressure tank threshold (e.g., about 3 pounds per square inch (psi)). Thus, the controller 120 can be configured to employ pressure sensor data corresponding to the pressure sensor signal to visually alert personnel that the pressure inside the tank is greater than or equal to the pressure tank threshold. In some examples, the light-emitting device 122 can be actuated to emit light by controller 120 in response the controller 102 determining that the amount of oil in the oil tank is equal to or less than an oil level threshold based on oil level sensor data provided by the oil level sensor.

In additional or alternative examples, the controller 120 can be configured to cause the light-emitting device 122 to be actuated in response to a surge arrester integrity signal from the surge arrester sensor 118 indicating a failure in the surge arrestor 106. In some examples, the device 102 can include a plurality of light-emitting devices 122 that are configured to emit a unique light indicative of a corresponding condition associated with the distribution transformer 102 or the surge arrester 106. For example, a first light-emitting device 122 can be configured to emit a first light to visually alert the personnel that the pressure inside the tank is greater than or equal to the pressure tank threshold, and a second light-emitting device 122 can be configured to emit a second light to visually alert the personnel that the surge arrestor 106 is experiencing a failure. In some examples, the first and second lights emitted by respective light-emitting devices 122 are similar light colors and in other examples are different light colors. Thus, the light-emitting device 122 can be employed to alert the personnel (e.g., visually) that the distribution transformer 104 and/or the surge arrester 106 may need repair (or replacement) or the location of where a system fault may have occurred.

In additional or alternative examples, the controller 120 can be configured to alert personnel to the location of distribution transformer 104 that may have been subjected to electrical surges and/or sags (e.g., system faults) by communicating fault alert data to the remote processing system 110. Each sensor 116 or 118 or an aggregate of sensors 116 and 118 can communicate with the controller 120. The controller 120 can be configured to receive respective sensor data and evaluate the respective sensor data (e.g., relative to corresponding sensor thresholds) and provide the fault alert data to the remote processing system 110. In some examples, the fault alert data can identify a respective sensor of the sensors 116 and 118 based on the evaluation of the respective sensor data relative to a corresponding sensor threshold, and the identified respective sensor can be indicative of a particular fault at the distribution transformer 104. In some examples, the remote processing system 110 can provide a fault location model that can assist with restoration efforts by communicating back a location, a frequency, and intensity of a distribution transformer fault.

In some examples, the distribution transformer sensors 116 includes the oil level sensor and the oil tank temperature sensor, which respectively can be configured to measure (e.g., capture, record, etc.) oil level and oil temperature data. The oil level and oil temperature data can be provided to the controller 120. The controller 120 can be configured to communicate the oil level and oil temperature data via the network 108 to the remote processing system 110. The sensor processing engine 112 can be configured to evaluate the oil level and oil temperature data to determine the oil level of the oil in the tank and/or the temperature of the oil in the tank. In some examples, the sensor processing engine 112 can be configured to compare the oil level data to a respective oil level threshold and the oil temperature data to a respective oil temperature threshold. In response to the oil level and/or oil temperature data being greater than or equal to a corresponding threshold, personnel can be alerted and can take appropriate action to mitigate distribution transformer failure. The communicated oil temperature data, and in some examples in combination with ambient temp and load (current) data generated by respective distribution transformer sensors 116 can be processed by the sensor processing engine 112 to calculate a cumulative loss of life and assist with end of life determination and asset health performance.

In some examples, the distribution transformer sensors 116 can include one or more current sensors that can be positioned relative to low voltage connections of the distribution transformer 104. In an example, the one or more current sensors include Rogowski coils or other forms of CT sensor coils. The one or more current sensors can be configured to sensing current flowing through the low voltage connections to provide sensor current data. The sensor current data can be provided to the controller 120 for communication to the remote processing system 110. In some examples, the remote processing system 110 can be configured to utilize the sensor data generated by the distribution transformer sensors 116 and/or the surge arrester sensor 118 by employing the prediction engine 114 to provide predictive asset maintenance (e.g., predict a transformer failure time) or notify (e.g., alert) personnel that the distribution transformer 104 may need maintenance (or replacement). In some examples, the prediction engine 114 can be configured to employ machine learning algorithms to process the sensor data to provide predictive maintenance information. The predictive maintenance information can be provided to an output device 128 for display thereon. Thus, the predictive maintenance information can identify when the distribution transformer 104 is likely to fail. The output device 128 can include one or more displays, such as a monitor, heads up display, cellular "app", virtual or augmented reality headset, or goggles which can be integrated with the remote processing system 110.

By way of example, the sensor processing engine 112 can be configured to evaluate the sensor data and generate sensor historical information characterizing a performance of one or more operational parameters of the distribution transformer 104 over a period of time (e.g., operating life cycle). The sensor historical information can be displayed on the output device 128. In some examples, the distribution transformer sensors 116 can include one or more current sensors that can be positioned relative to high voltage connections of the distribution transformer 104. In an example, the one or more current sensors include Rogowski coils or other forms of CT sensor coils. The one or more current sensors can be configured to sensing current flowing through the high voltage connections to provide sensor current data. The sensor current data can be provided to the controller 120 for communication to the remote processing system 110.

In some examples, the remote processing system 110 can be configured to utilize the sensor data generated by the distribution transformer sensors 116 and/or the surge arrester sensor 118 by employing the prediction engine 114 to indicate current on the high and low side of the transformer (e.g., communicate a transformer failure by using a differential current methodology from high to low) or notify (e.g., alert) personnel that the distribution transformer 104 may need maintenance (or replacement). In some examples, the sensor processing engine 112 can be configured to cause the location information provided by the GPS 126 to be displayed on a graphical map (e.g., on a mapping service, such as a web mapping service) on the output device 128 to inform the user as to a location (e.g., GPS coordinate, street location, etc.) of the distribution transformer 104. Accordingly, the TPM device 102 device allows for remote monitoring of the transformer and arrester operational parameters, such that personnel can take appropriate actions or measures to minimize transformer and arrester failures and improve overall maintenance or performance of the transformer and arrester, as well as improve response times in the case of the complete transformer or arrester failure.

former and arrester, as well as improve response times in the case of the complete transformer or arrester failure.

In some examples, the distribution transformer 104 can be retrofitted with the TPM device 102. For example, a pressure relief valve of the distribution transformer 104 can be detached to provide access to a pressure valve receiving port of the distribution transformer 104. In some examples, the pressure relief valve can be untightened from the pressure valve receiving port to provide access to a threaded hole of the pressure valve receiving port. An adapter can be mounted relative to the pressure valve receiving port (e.g., a cylindrical pressure valve receiving port), such that the adapter surrounds the pressure valve receiving port. The pressure valve receiving port can be configured such that a portion of the cylindrical pressure valve receiving port extends away from a body of the distribution transformer 104. In some examples, the cylindrical adapter can be positioned relative to the cylindrical pressure valve receiving port, such that the portion of the cylindrical pressure valve receiving port extending away from the body of the distribution transformer 104 can engage the cylindrical adapter.

By way of further example, the TPM device 102 can be positioned relative to the distribution transformer 102, such that the adapter extends through a first opening of the TPM device 102 (e.g., a body of the TPM device 102) to support the TPM device 102. The TPM device 102 can be secured to the distribution transformer 104 with a fastener to fix (e.g., rigidly) the TPM device 102 to the distribution transformer 104. The pressure relief valve can be reattached, such that a portion of the pressure relief valve extends through the fastener and the first opening of the TPM device 102 to engage the pressure valve receiving port. In some examples, the cylindrical adapter can be inserted through the first opening and can be configured to extend through the body of the TPM device 102 to a second opening of the TPM device 102, such that a portion of the cylindrical adapter protrudes through the second opening away from the body of the distribution transformer 104. In some examples, the portion of the cylindrical adapter protruding away from the second opening can include external threads. In these examples, a threaded nut can be attached to the portion of the cylindrical adapter protruding away from the body of the distribution transformer 104 by rotating the threaded nut relative to the external threads to rigidly secure the TPM device 102 to the distribution transformer 104.

In some examples, the pressure relief valve can include a cylindrical valve body and external threads at an end opposite of an end that can include a valve head. In these examples, the portion of the cylindrical adapter protruding away from the body of the distribution transformer 104 can include internal threads. The pressure relief valve can be attached by inserting the external threads of the pressure relief valve into the cylindrical adapter and threading the pressure relief valve onto the cylindrical adapter by rotating the pressure relief valve relative to the cylindrical adapter to secure the pressure relief valve to the distribution transformer 104.

By way of further example, to retrofit the distribution transformer 104, a wire harness device 130 can be employed. Although FIG. 1 illustrates the wire harness device 130 separate from the TPM device 102, in some examples, the wire harness device 130 can form part of the TPM device 102. The wire harness device 130 can include a first end and a second end. The first end of the wire harness device 130 can be connected to the TPM device 102 to enable the controller 120 to communicate with one or more sensors and/or light emitting devices of the wire harness device 130. In some examples, the wire harness device 130 can include the light-emitting device 122. The second end of the wire harness device 130 can be routed along an outer surface of the distribution transformer 104 toward one of an undercarriage of the pole type distribution transformer, an outer edge of an air space of the pad mounted type distribution transformer or an exterior surface of the vault type distribution transformer, such that the light emitting device 122 of the wire harness device 130 can be located at a location on the distribution transformer 104 that allows for visual identification, such as by a user (e.g., personnel).

In some examples, the second end of the wire harness device 130 can include a plurality of wire harness sensors and can be further routed along the outer surface of the distribution transformer 104 toward bushings of the distribution transformer 104 for voltage, current and temperature sensing. The plurality of wire harness sensors can correspond to a portion of the distribution sensors 116. The plurality of wire harness sensors can be positioned relative to the bushings to sense a current flowing through and the voltage at the bushings and the temperature of the bushings. The wire harness device 130 can include along a face proximate to the outer surface of the body of the distribution transformer 104 one of adhesive or magnetic anchors to secure the wire harness device 130 to the body of the distribution transformer 104.

In some examples, to retrofit the distribution transformer 104 with the TPM device 102, a mounting bracket can be positioned relative to at least one arrester nut of the distribution transformer 104, such that the at least one arrester nut protrudes away from the distribution transformer 104 through a slot opening (e.g., a mounting slot) of the mounting bracket. The mounting bracket can be aligned (e.g., slid up and/or down), such that an upper portion of the mounting bracket is positioned a distance above an oil fill hole of the distribution transformer 104. The mounting bracket can be secured to the distribution transformer 104 via at least one bolt. The TPM device 102 can be secured to the mounting bracket to enable the TPM device 102 to detect an oil level of oil inside the distribution transformer 014. Accordingly, the distribution transformer 104 can be retrofitted with the TPM device 102 without requiring replacement or extensive modification of the distribution transformer, and in some examples, enable the oil level inside the distribution transformer 104 to be externally monitored.

Figure 2:
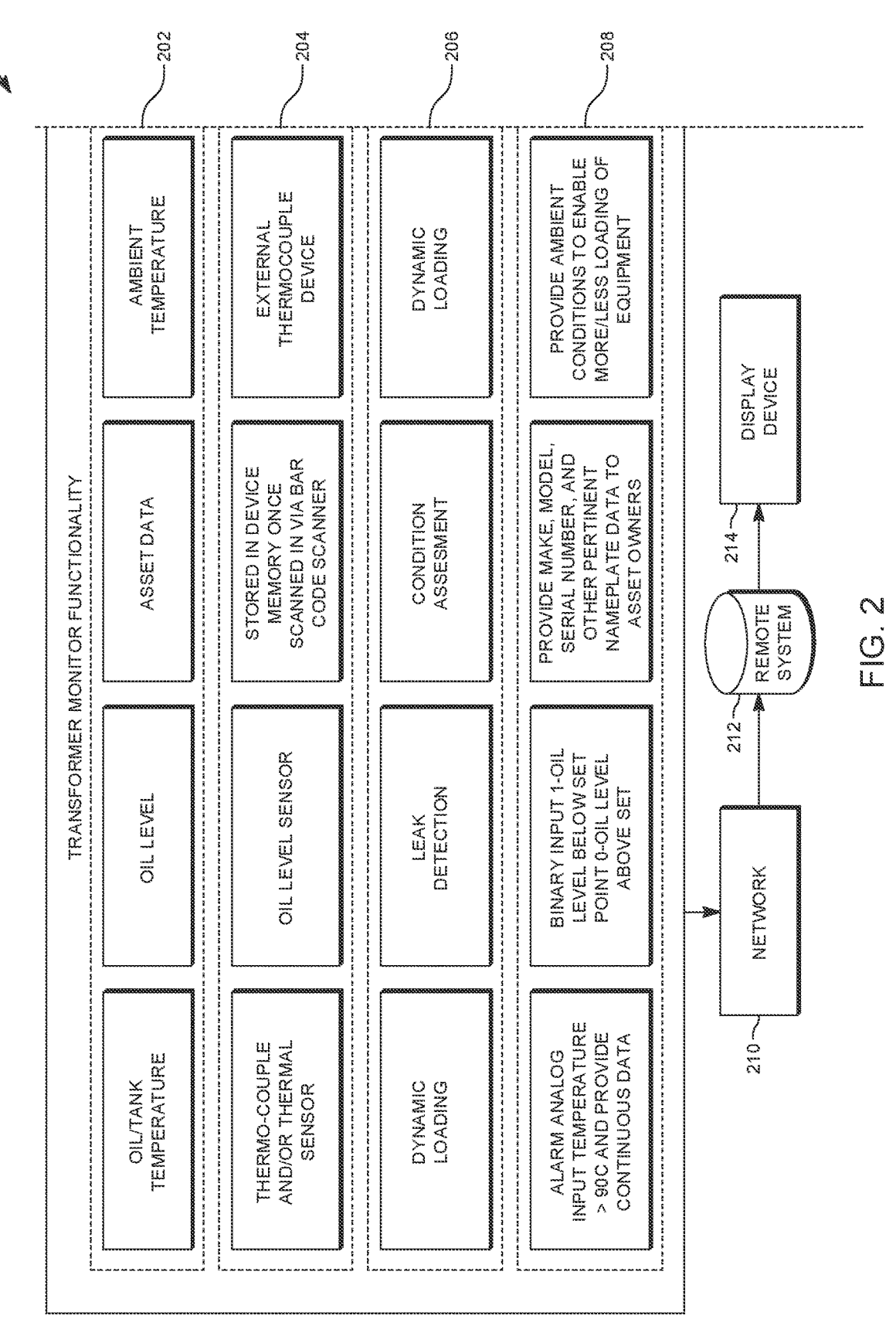
FIGS. 2-4 is an example of a block representation of transformer monitoring functionality and processing.
Figure 3:
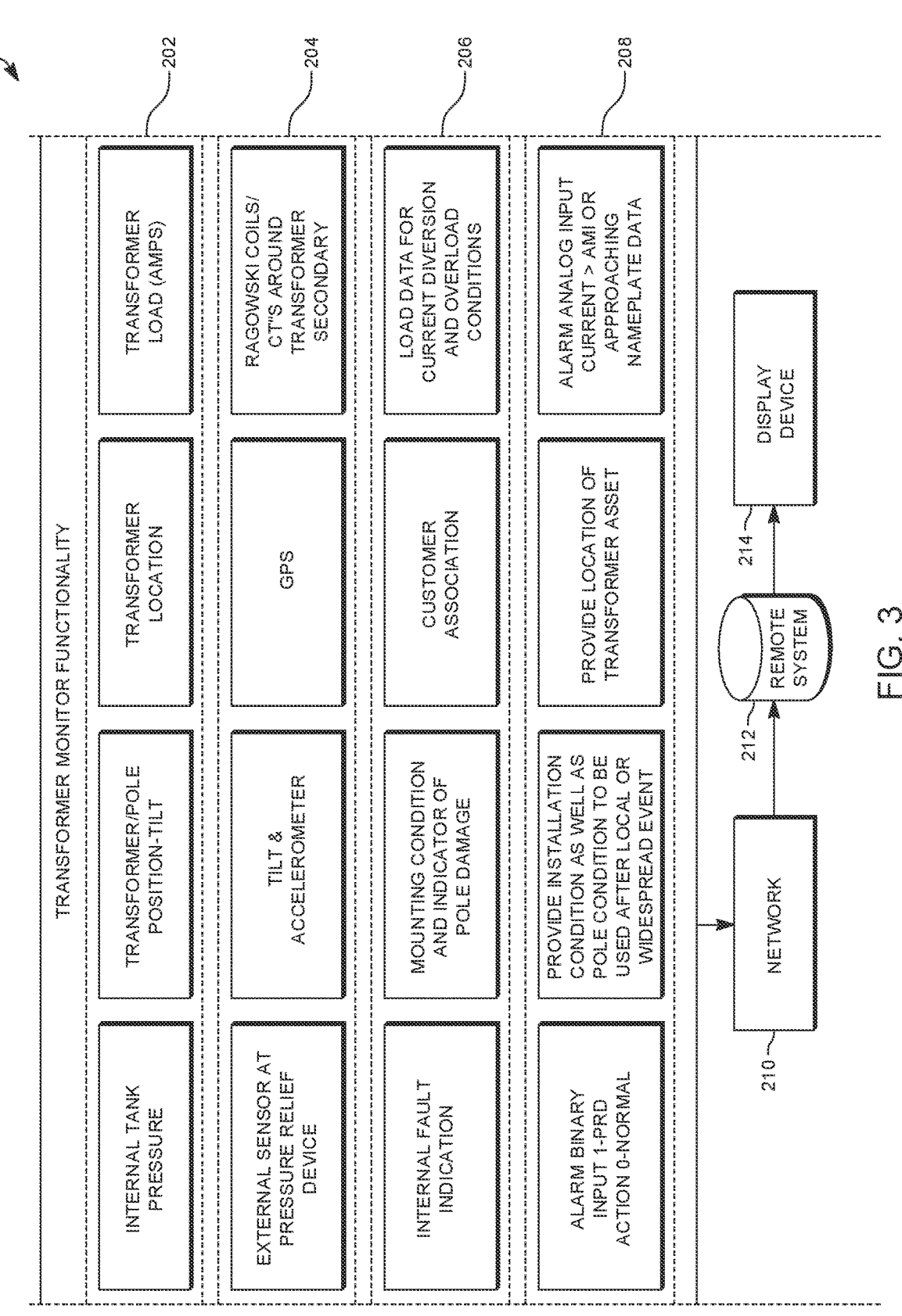
Figure 4:
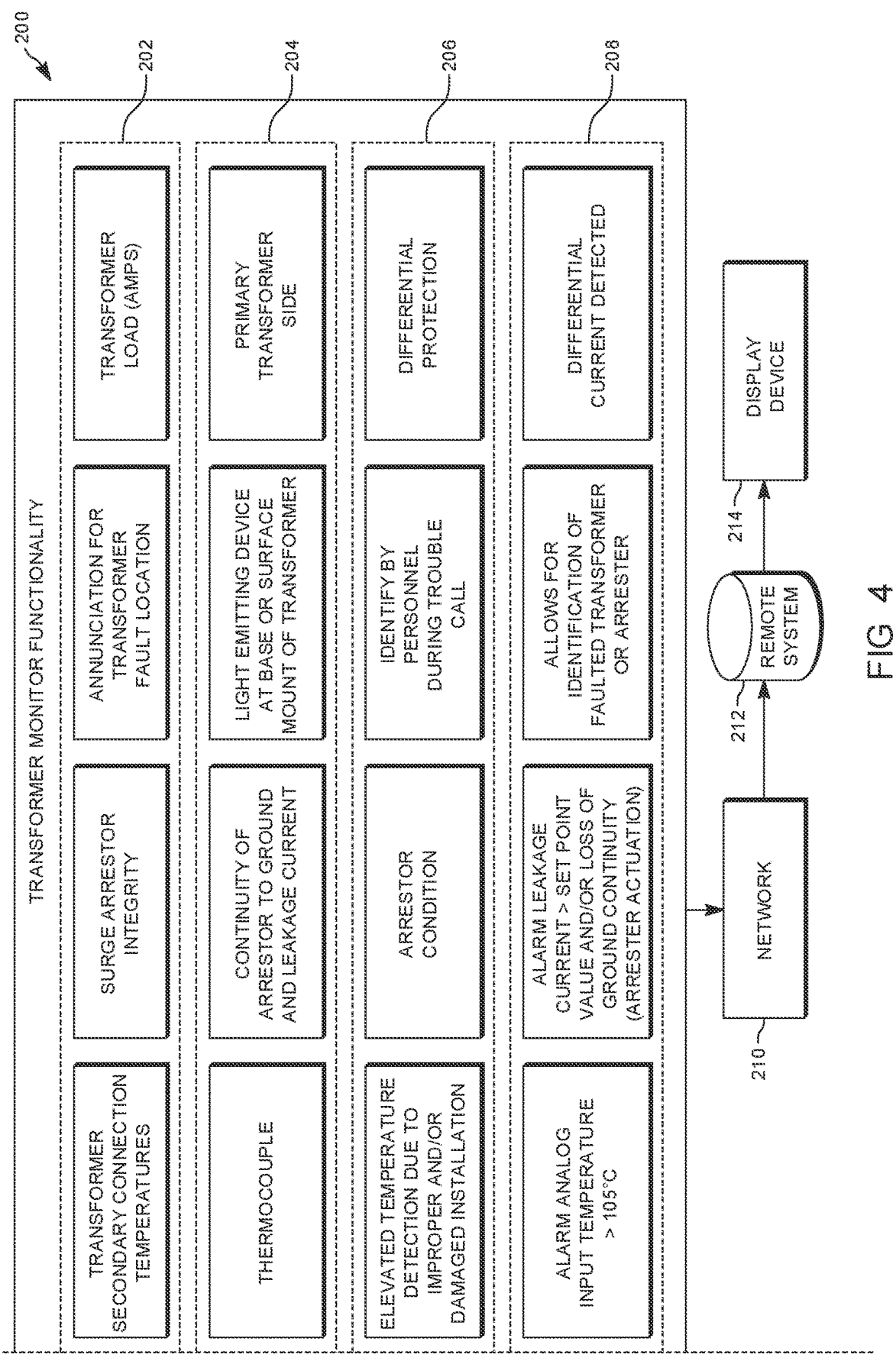

FIGS. 2-4 is an example of a block representation of transformer monitoring functionality and processing. The block diagrams illustrated in FIGS. 2-4 can be associated with one or more aspects of operations of the TPM device 102 and the remote processing system 110, as illustrated in FIG. 1. Therefore, reference may be made to the example of FIG. 1 in the following description of the example of FIGS. 2-4. As illustrated in FIGS. 2-4, at block diagram 202 the TPM device 102 can be configured to provide sensor data associated with a plurality of different operational parameters of the distribution transformer 104 and the surge arrester 106. In some examples, the TPM device 102 is configured to provide non-sensor data, such as asset information and location information. By way of example, at block diagram 202, the sensor and non-sensor data that can be provided by the TPM device 102 can include oil temperature data, tank temperature data, oil level data, asset data, ambient temperature data, internal tank pressure data, transformer or pole position or tilt data, transformer location data, transformer load (primary and secondary) data, transformer secondary connection temperature data, surge arrester integrity data, and annunciation for transformer fault location. The data associated with the distribution transformer 104 or the surge arrester 106, as illustrated in FIGS. 2-4 at block diagram 204, can be monitored via a plurality of different types of sensors or according to different methodologies, as illustrated at block diagram 206. As illustrated at block diagram 208, the data can be employed for determining a plurality of operational parameters of the distribution transformer 104 and a condition of the surge arrester 106. At block diagram 208, analytical and function thresholds for alerting can be implemented (e.g., at the remote processing system 110 and in some examples at the controller 120, as illustrated in FIG. 1), such that personnel can take appropriate action.

In some examples, a network 210, such as the network 108, as illustrated in FIG. 1, can be employed to communicate the sensor and non-sensor data to a remote processing system 212 at the block diagram 202. The remote processing system 212 can correspond to the remote processing system 110, as illustrated in FIG. 1. The remote processing system 212 can be configured to implement at least some of the analytical and function thresholds for the alerting illustrated at the block diagram 208. The remote processing system 212 can be configured to generate an electric utility dashboard that can be displayed on a display device 214. The display device 214 can correspond to the output device 128, as illustrated in FIG. 1. The remote processing system 212 can be configured to alert personnel of distribution transformer or surge arrester failures via the dashboard and can employ artificial intelligence algorithms based on the data at block diagram 202 to identify overloading and make failure predictions for the distribution transformer 104 and the surge arrester 106.

In further examples, the remote processing system 212 can be configured to utilize dynamic loading criteria based on ambient temperature conditions and peak loading or contingency operations. In additional or other examples, the remote processing system 212 can be configured to provide situational awareness information for the distribution transformer 104 or the surge arrester 106. The situational awareness information can include asset information, asset location information, loss of oil information, bad or loose connection information, surge arrester functionality information, improper mechanical installation information, transformer damage information, pole information, faulted transformer information, theft of power, and arrester health along with location identification information. The situational awareness information can be provided via the dashboard being displayed on the display device 214.

Figure 5:
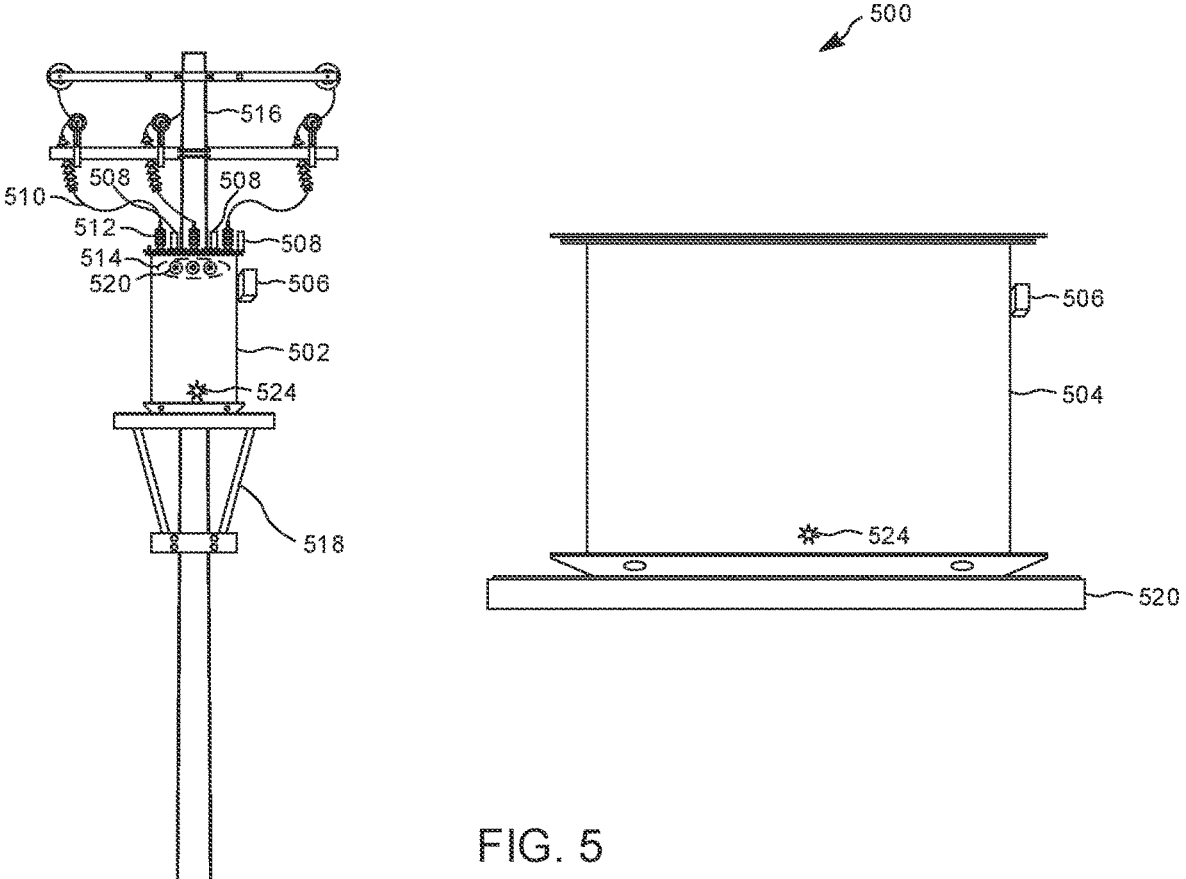
FIG. 5 is an example of a distribution transformer configured with a TPM device.

FIG. 5 is an example of distribution transformers 502 and 504 retrofitted with a TPM device 506. In some examples, the distribution transformers 502 and 504 can correspond to the distribution transformer 104 and the TPM device 506 can correspond to the TPM device 102, as illustrated in FIG. 1. Therefore, reference may be made to the example of FIG. 1 in the following description of the example of FIG. 5. The distribution transformer 502 can correspond to a pole-mounted distribution transformer and the distribution transformer 504 can correspond to a pad-mounted distribution transformer. The pole-mounted distribution transformer 502 and the pad-mounted distribution transformer 504 can be retrofitted with the TPM device 506 according to the methods described herein.

In some examples, the pole-mounted distribution transformer 502 can include surge arrester sensors 508, which the TPM device 506 can be configured to monitor for determining an integrity of surge arrestors (not shown in FIG. 5), such as at a remote processing system (e.g., the remote processing system 110, as illustrated in FIG. 1). In some examples, primary distribution lines 510 can be coupled to respective primary bushings 512 of the distribution transformer 502 which can be associated with a corresponding arrestor with which a respective arrester sensor 508 can be associated. By way of further example, the pole-mounted distribution transformer 502 can include secondary bushings 514 for coupling to secondary distribution lines (not shown in FIG. 5) for distributing power, such as to a consumer, a business, etc. As illustrated in FIG. 5, the pole-mounted distribution transformer 502 can be supported (e.g., mounted) on a pole 516 by a distribution mounting apparatus 518.

In some examples, the pole-mounted distribution transformer 502 can include CT/Rogowski coils 520 for sensing current flowing through the secondary bushings 514. The sensor current information from the CT/Rogowski coils 520 can be provided to the TPM device 506 for processing and/or communicating to a remote processing system (e.g., the remote processing system 110, as illustrated in FIG. 1). Although FIG. 5 illustrates CT/Rogowski coils 520 for sensing current flowing through the secondary bushings 514, in additional or alternative examples respective CT/Rogowski coils 520 can be employed to sense the current flowing through the primary bushings 512.

In some examples, the pad-mounted distribution transformer 504 can be supported by a mounting pad 522 (e.g., a concrete pad). The pad-mounted distribution transformer 504 can include respective surge arrester sensors 508 as the pole-mounted distribution transformer 504, and thus the TPM device 506 can be configured to monitor surge arrestor integrity of respective surge arrestors at the pad-mounted distribution transformer 504. By way of further example, the pad-mounted distribution transformer 504 can include primary and secondary bushings 512 and 514 for receiving and distributing power such as the pole-mounted distribution transformer 502. In further examples, the pad-mounted distribution transformer 504 can be configured with CT/Rogowski coils 520 with respect to primary and/or secondary bushings 512 and 514 of the pad-mounted distribution transformer for sensing current flow through a respective bushing.

In some examples, each of the pole and pad-mounted distribution transformers 502 and 504 can further include a location 524 for mounting a light emitting device (e.g., the light emitting device 126, as illustrated in FIG. 1). The light-emitting device can be actuated to alert a user (e.g., personnel) in response to an event at the pole or pad-mounted distribution transformer 502 and 504, such as when a pressure of an oil tank (not shown in FIG. 5) of the pole or pad-mounted distribution transformer 502 and 504 exceeds a threshold reference.

In view of the foregoing structural and functional features described above, an example method will be better appreciated with reference to FIGS. 6-10. While, for purposes of simplicity of explanation, the example methods of FIGS. 6-10 are shown and described as executing serially, it is to be understood and appreciated that the present example is not limited by the illustrated order, as some actions could in other examples occur in different orders, multiple times or concurrently from that shown and described herein.

FIG. 6 is a flow diagram depicting an example of a method 600 for retrofitting a distribution transformer. An existing distribution transformer (e.g., the distribution transformer 104, as illustrated in FIG. 1 or the distribution transformer 502 or the 504, as illustrated in FIG. 5) can be retrofitted with a TPM device (e.g., the TPM device 102, as illustrated in FIG. 1 or the TPM device 506, as illustrated in FIG. 5) according to the method 600 to allow for remote monitoring of transformer or surge arrester operational parameters, such as described herein. In some examples, the method 600 can be implemented without the removal of the distribution transformer from a transformer mounting apparatus for mounting the distribution transformer, disconnecting the distribution transformer from a distribution line, and/or while the distribution transformer is operational.

The method 600 can begin at 602 by a pressure relief valve being detached from a distribution transformer to provide access to a pressure valve receiving port of the distribution transformer. At 604, an adapter can be mounted relative to the pressure valve receiving port such that the adapter can surround the pressure valve receiving port. At 606, a TPM device (e.g., the TPM device 102, as illustrated in FIG. 1) can be positioned relative to the distribution transformer, such that the adapter can extend through an opening of a housing of the TPM device to support the TPM device. At 608, the housing of the TPM device can be secured with a fastener to the distribution transformer to rigidly fix the TPM device to the distribution transformer. At 610, the pressure relief valve can be attached, such that a portion of the pressure relief valve extends through the fastener and the opening of the housing of the TPM device to engage the pressure valve receiving port, and thereby securing the pressure relief valve to the distribution transformer.

FIG. 7 is a flow diagram depicting another example of a method 500 for retrofitting a distribution transformer. An existing distribution transformer (e.g., the distribution transformer 104, as illustrated in FIG. 1 or the distribution transformer 502 or the 504, as illustrated in FIG. 5) can be retrofitted with a TPM device (e.g., the TPM device 102, as illustrated in FIG. 1 or the TPM device 506, as illustrated in FIG. 5) according to the method 700 to allow for remote monitoring of transformer or surge arrester operational parameters, such as described herein. In some examples, the method 700 can be implemented without the removal of the distribution transformer from a transformer mounting apparatus for mounting the distribution transformer, disconnecting the distribution transformer from a distribution line, and/or while the distribution transformer is operational.

The method 700 can begin at 702 by detaching a pressure relief valve from the distribution transformer to provide access to a threaded hole of a cylindrical pressure valve receiving port of the distribution transformer. At 704, a cylindrical adapter can be positioned relative to the cylindrical pressure valve receiving port, such that a portion extending away from a body of the distribution transformer engages the cylindrical adapter. At 706, the cylindrical adapter can be inserted through a first opening of a TPM device (e.g., the TPM device 102, as illustrated in FIG. 1) to extend the cylindrical adapter through a body of the TPM device to a second opening of the TPM device, such that a portion of the cylindrical adapter protrudes through the second opening away from the body of the distribution transformer. The portion of the cylindrical adapter protruding away from the second opening can include external threads. At 708, a threaded nut can be attached to the portion of the cylindrical adapter protruding away from the body of the distribution transformer by rotating the threaded nut relative to the external threads to rigidly secure the TPM device to the distribution transformer. At 710, the pressure relief valve can be attached, such that a portion of the pressure relief valve engages the cylindrical pressure valve receiving port.

Figure 8:
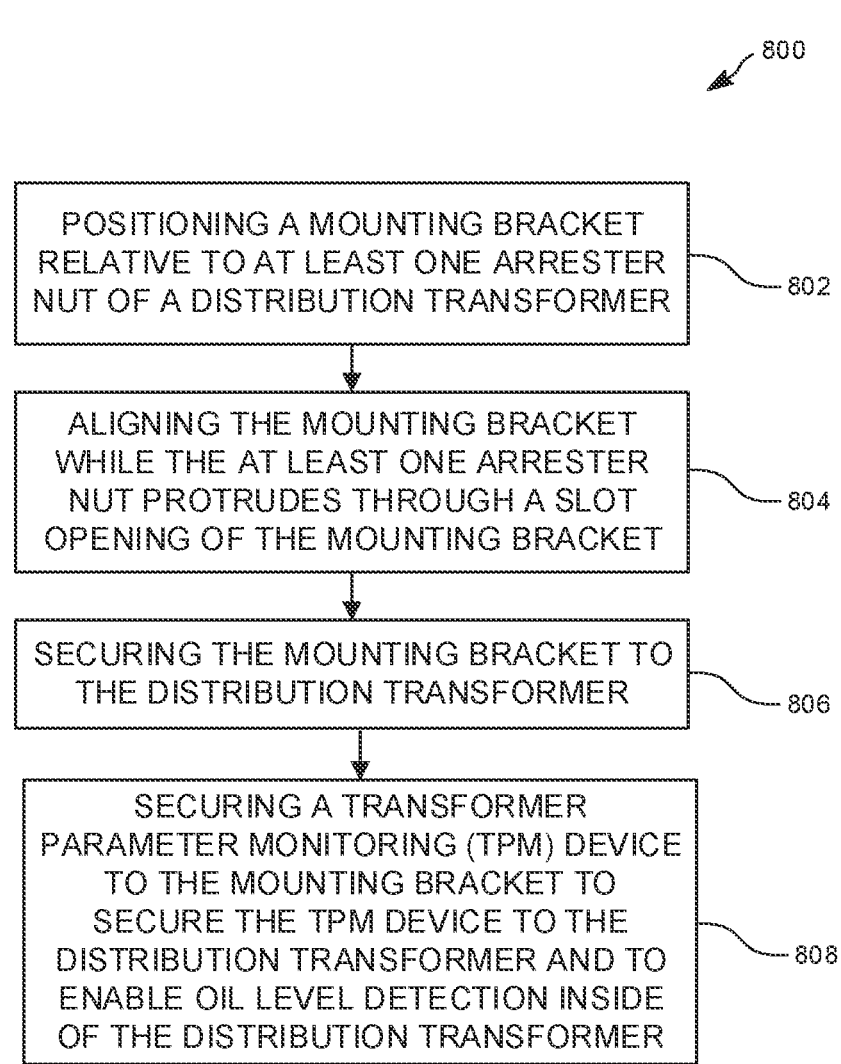
FIG. 8 is a flow diagram depicting an even further example of a method for retrofitting a distribution transformer with a TPM device.

FIG. 8 is a flow diagram depicting another example of a method 800 for retrofitting a distribution transformer. An existing distribution transformer (e.g., the distribution transformer 104, as illustrated in FIG. 1 or the distribution transformer 502, as illustrated in FIG. 5) can be retrofitted with a TPM device (e.g., the TPM device 102, as illustrated in FIG. 1 or the TPM device 506, as illustrated in FIG. 5) according to the method 800 to allow for remote monitoring of transformer or surge arrester operational parameters, such as described herein. In some examples, the method 800 can be implemented without the removal of the distribution transformer from a transformer mounting apparatus for mounting the distribution transformer, disconnecting the distribution transformer from a distribution line, and/or while the distribution transformer is operational.

The method 800 can begin at 802 by positioning a mounting bracket relative to at least one arrester nut of the distribution transformer, such that the at least one arrester nut protrudes away from the distribution transformer through a slot opening (e.g., a mounting slot) of the mounting bracket. At 804, the mounting bracket can be aligned (e.g., slid up and/or down), such that an upper portion of the mounting bracket is positioned a distance above an oil fill hole of the distribution transformer. For example, the mounting bracket can be aligned by sliding the mounting bracket up and/or down relative to a side (e.g., surface) of the distribution transformer while the at least one arrester nut protrudes through the slot opening of the mounting bracket to position the upper portion of the mounting bracket at the distance above the oil fill hole. In some examples, the mounting bracket can be aligned while the at least one arrester nut protrudes through the slot opening of the mounting bracket, such that the TPM device can be enabled to detect an oil level of oil inside the distribution transformer. By way of further example, the upper portion of the mounting bracket can include an alignment mark for aligning the upper portion of the mounting bracket at the distance above the oil fill hole.

At 806, the mounting bracket can be secured to the distribution transformer via at least one bolt. In some examples, the mounting bracket is secured by threading the at least one arrester nut onto the at least one bolt. In some examples, a shaft of the at least one bolt is passed through a hole of the at least one arrester nut to secure the mounting bracket to the distribution transformer. At 808, the TPM device can be secured to the mounting bracket to enable the TPM device to detect the oil level of oil inside the distribution transformer, and some examples, other conditions or physical characteristics associated with the distribution transformer and/or surge arrester, as described herein.

By way of further example, the TPM device can include at least one oil sensor that can be configured to detect the oil level of the oil inside of the distribution transformer. The at least one oil sensor can be located in an upper portion of the TPM device. Because the at least one oil sensor is located in the upper portion of the TPM device and the mounting bracket was positioned relative to the oil fill hole, the mounting of the TPM device on the mounting bracket positions the at least one oil sensor proximal to the oil inside of the distribution transformer, thereby enabling oil level detection of the oil inside of the distribution transformer. Accordingly, the TPM device can externally measure the oil level of the oil inside the distribution transformer and other associated physical conditions and/or parameters of the distribution transformer and the surge arrester, as described herein. Accordingly, the distribution transformer can be retrofitted with the TPM device without requiring replacement or extensive modification of the distribution transformer and allows for monitoring of the oil level inside the distribution and in some examples associated physical conditions and/or parameters of the distribution transformer (e.g., a pressure inside in the oil tank), or the surge arrester.

Figure 9:
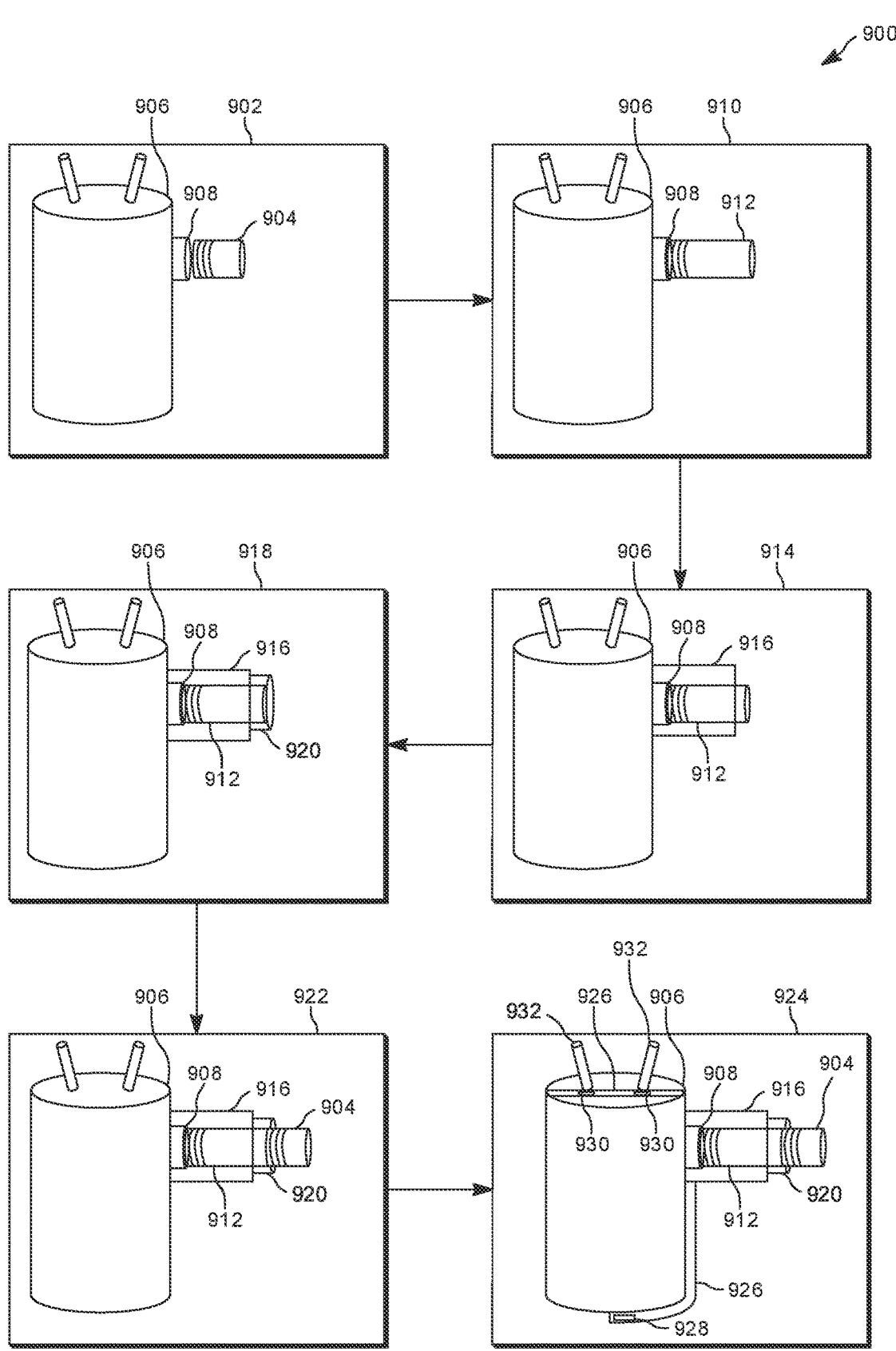
FIG. 9 is a flow diagram depicting another example of a method for retrofitting a distribution transformer.

FIG. 9 is a flow diagram depicting an even further example of a method 900 for retrofitting a distribution transformer. An existing distribution transformer (e.g., the distribution transformer 104, as illustrated in FIG. 1 or the distribution transformer 502 or the 504, as illustrated in FIG. 5) can be retrofitted with a TPM device (e.g., the TPM device 102, as illustrated in FIG. 1 or the TPM device 506, as illustrated in FIG. 5) according to the method 900 to allow for remote monitoring of transformer or surge arrester operational parameters, such as described herein.

The method 900 can begin at 902 by detaching a pressure relief valve 904 of a distribution transformer 906 to provide access to a pressure valve receiving port 908 of the distribution transformer 906. In some examples, the pressure relief valve 904 can be untightened from the pressure valve receiving port 908 to provide access to a threaded hole of the pressure valve receiving port 908. The method 900 can include at 910 mounting an adapter 912 (e.g., a cylindrical adapter) relative to the pressure valve receiving port (e.g., a cylindrical pressure valve receiving port) 908, such that the adapter 912 surrounds the pressure valve receiving port. The pressure valve receiving port 908 can be configured such that a portion of the cylindrical pressure valve receiving port 908 extends away from a body of the distribution transformer 906. In some examples, the cylindrical adapter 912 can be positioned relative to the cylindrical pressure valve receiving port 908, such that the portion of the cylindrical pressure valve receiving port 908 extending away from the body of the distribution transformer 906 can engage the cylindrical adapter 912.

The method 900 can include at 914 positioning a TPM device 916 relative to the distribution transformer 906, such that the adapter 912 extends through a first opening of the TPM device 916 (e.g., a body of the TPM device 916) to support the TPM device 916. The method 900 can include at 918 securing the TPM device 916 to the distribution transformer 906 with a fastener 920 to fix (e.g., rigidly) the TPM device 916. At 922, the method 900 can include reattaching the pressure relief valve 904, such that a portion of the pressure relief valve 904 extends through the fastener 920 and the first opening of the TPM device 914 to engage the pressure valve receiving port 908.

In some examples, the cylindrical adapter 912 can be inserted through the first opening and can be configured to extend through the body of the TPM device 916 to a second opening of the TPM device 916, such that a portion of the cylindrical adapter 912 protrudes through the second opening away from the body of the distribution transformer 906. In some examples, the portion of the cylindrical adapter 912 protruding away from the second opening can include external threads. In these examples, a threaded nut can be attached to the portion of the cylindrical adapter 912 protruding away from the body of the distribution transformer 906 by rotating the threaded nut relative to the external threads to rigidly secure the TPM device 916 to the distribution transformer 906.

In some examples, the pressure relief valve 904 can include a cylindrical valve body and external threads at an end opposite of an end that can include a valve head. In these examples, the portion of the cylindrical adapter 912 protruding away from the body of the distribution transformer 906 can include internal threads. The pressure relief valve 904 can be attached by inserting the external threads of the pressure relief valve 904 into the cylindrical adapter 912 and threading the pressure relief valve 904 onto the cylindrical adapter 912 by rotating the pressure relief valve 904 relative to the cylindrical adapter 912 to secure the pressure relief valve 904 to the distribution transformer 906.

The method 900 can include at 924 routing a wire harness device 926 from the TPM device 916 to an undercarriage of the distribution transformer 906. The wire harness device 926 can include a first end and a second end. The first end of the wire harness device 926 can be connected to the TPM device 916 to enable a controller of the TPM device 916 (e.g., the controller 120, as illustrated in FIG. 1) to communicate with one or more sensors and/or light-emitting devices (e.g., the light-emitting device 122, as illustrated in FIG. 1) of the wire harness device 926. In some examples, the wire harness device 926 can include the light-emitting device 928. In some examples, at 924, the second end of the wire harness device 926 can be routed along an outer surface of the distribution transformer 916 toward an undercarriage of the pole type distribution transformer, such that the light emitting device 928 can be located at a location (e.g., the undercarriage) on the distribution transformer 916 that allows for visual identification, such as by a user (e.g., personnel).

In some examples, at 924, the second end of the wire harness device 926 can include a plurality of wire harness sensors 930 and can be further routed along the outer surface of the distribution transformer 906 toward primary and secondary bushing connections 932 of the distribution transformer 906 for current and temperature sensing. The plurality of wire harness sensors 930 can be positioned relative to the bushings 932 to sense a current flowing through the bushings 932 and a temperature of the bushings 932. The wire harness device 926 can include along a face proximate to the outer surface of the body of the distribution transformer 906 one of adhesive or magnetic anchors to secure the wire harness device 926 to the body of the distribution transformer 906. Accordingly, the distribution transformer 906 can be retrofitted with the TPM device 916 without requiring replacement or extensive modification of the distribution transformer 906.

Figure 10:
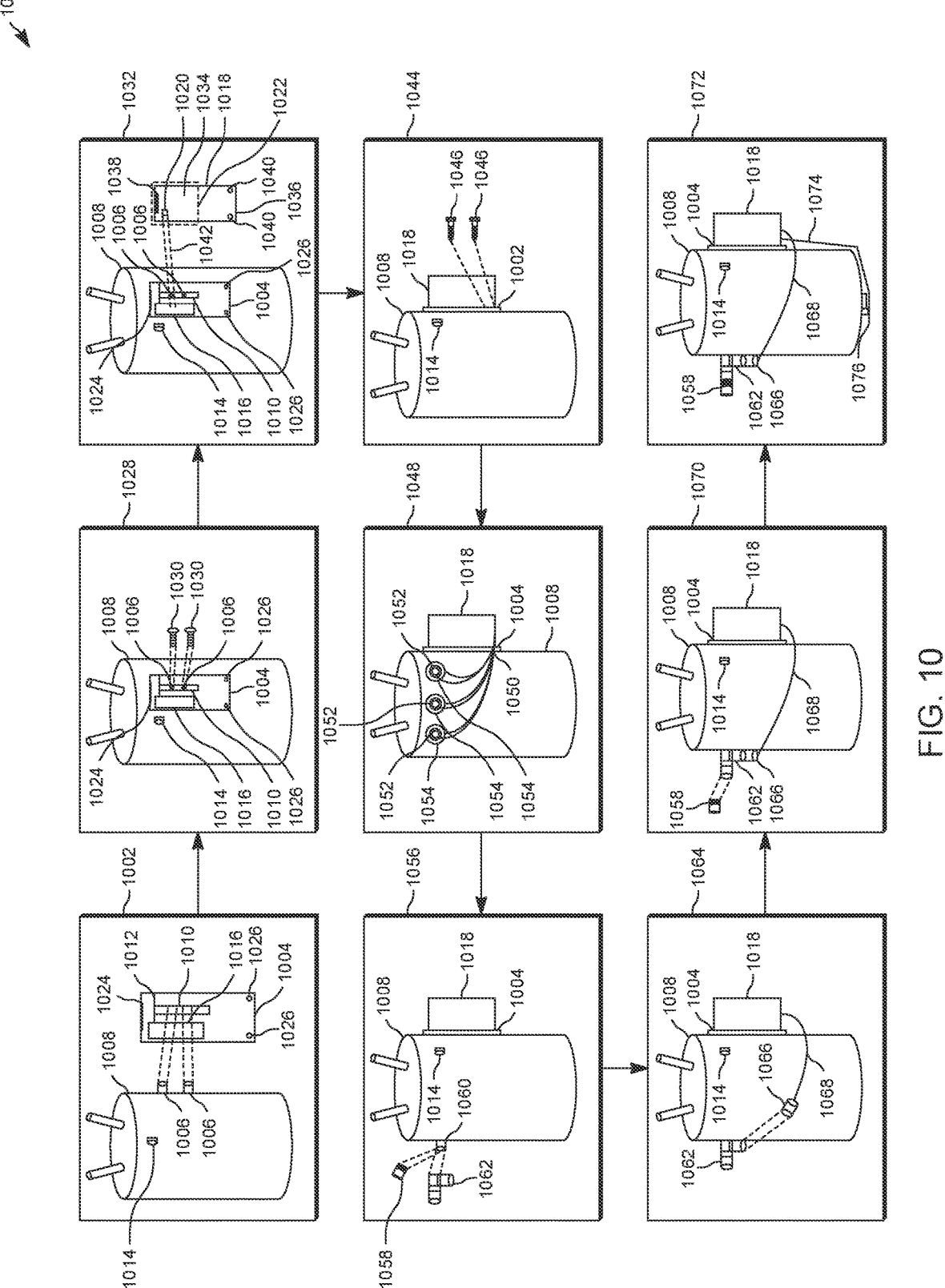
FIG. 10 is a flow diagram depicting another example of a method for retrofitting a distribution transformer.

FIG. 10 is a flow diagram depicting another example of a method 1000 for retrofitting a distribution transformer. An existing distribution transformer (e.g., the distribution transformer 104, as illustrated in FIG. 1 or the distribution transformer 502 and the 504, as illustrated in FIG. 5) can be retrofitted with a TPM device (e.g., the TPM device 102, as illustrated in FIG. 1 or the TPM device 506, as illustrated in FIG. 5) according to the method 1000 to allow for remote monitoring of transformer or surge arrester operational parameters, such as described herein.

The method 1000 can begin at 1002 by positioning a mounting bracket 1004 relative to a set of arrester nuts 1006 on a distribution transformer 1008, such that the set of arrester nuts 1006 protrudes away from the distribution transformer 1008 through a mounting slot opening 1010 of the mounting bracket 1004. For example, the mounting bracket 1004 can be aligned (e.g., slid up and/or down), such that an alignment mark 1012 of the mounting bracket 1004 is positioned parallel to an oil fill hole 1014 of the distribution transformer 1008. In some examples, the alignment mark 1012 is positioned parallel to a bottom of the oil fill hole 1014. In some examples, the alignment mark 1012 is printed or scribed thereon on the mounting bracket 1004. In other examples, the alignment mark 1012 can be integrated into the mounting bracket 1012. For example, the alignment mark 1012 can correspond to an alignment rib that extends along at least a portion of a width of the mounting bracket 1012. Although the distribution transformer 1004 is illustrated in FIG. 10 as including a set of arrester nuts 1006, in some examples, the distribution transformer 1004 can include a single arrester nut.

The mounting bracket 1004 can include a second opening 1016 to enable the measurement of an oil level of oil inside the distribution transformer 1008. For example, as described herein, a TPM device 1018 can include at least one oil sensor 1020 that can be configured to measure the oil level of the oil inside of the distribution transformer 1008. The at least one oil sensor 1020 can be located (e.g., positioned) in an upper portion 1022 of the TPM device 1018. The TPM device 1018 can be secured to the mounting bracket 1004, such that at least one oil sensor 1020 is proximal to the second opening 1016. Because the second opening 1016 is proximal to an oil tank of the distribution transformer 1008 in response to the mounting bracket 1004 being secured to the distribution transformer the TPM device 1018 is located proximal (e.g., next to) to the oil tank inside of the distribution transformer 1008, such that the oil level of the oil can be detected.

In some examples, a plurality of oil sensors 1020 is located in the upper portion 1022 of the TPM device 1018. The plurality of oil sensors 1020 can be separated by a given distance from each other and arranged in an array. In response to securing the TPM device 1018 to the mounting bracket 1004, the array of the plurality of sensors 1020 can be located proximal to the oil tank inside of the distribution transformer 1008, such that the oil level of the oil can be detected. An oil sensor as used herein can include any type of device that can allow for measuring or determining the oil level of the oil inside the distribution transformer. In some examples, the mounting bracket 1004 can include a lip edge 1024 for enabling engagement of the TPM device 1018 with the mounting bracket 1004. In some examples, the mounting bracket 1004 can include fastener holes 1026 for receiving respective fastener devices to secure the TPM device 1018 to the distribution transformer 1004.

In some examples, at 1028, the mounting bracket 1004 can be secured to the distribution transformer 1008 via a first set of fastener devices 1030 while the alignment mark 1012 of the mounting bracket 1004 is positioned parallel to the oil fill hole 1014 or the bottom of the oil fill hole 1014. In some examples, the mounting bracket 1004 can be secured by threading the set of arrester nuts 1006 onto a set of bolts corresponding to the first set of fastener devices 1030. In some examples, a shaft of each bolt can be passed through a hole of a respective arrester nut 1006 to secure the mounting bracket 1004 to the distribution transformer 1008.

In some examples, at 1032, the TPM device 1018 can be positioned relative to the mounting bracket 1004 to couple the TPM device 1018 to the mounting bracket 1004. For example, a bottom surface 1034 of a housing 1036 of the TPM device 1018 can be positioned proximal to the mounting bracket 1004. In some examples, the TPM device 1018 can include a curved edge 1038 that curves downward on the bottom surface 1034 of the housing 1036. The TPM device 1018 can be configured to engage the curved edge 1038 and the lip edge 1024, which can curve upward, to couple the TPM device 1018 to the mounting bracket 1004. In some examples, the TPM device 1018 can be toed-in on the top and rotated to couple the TPM device 1018 to the mounting bracket 1004. In some examples, the TPM device 1018 is positioned relative to the mounting bracket 1004, such that corresponding fastener holes 1040 of the TPM device 1018 align with the respective fastener holes 1026. By way of further example, the TPM device 1018 can be positioned relative to the mounting bracket 1004, such that the at least one oil sensor 1020 is positioned with the second opening 1016, which is illustrated at 1032 with a set of dashed-lines 1042. Because the second opening 1016 is proximal to the oil tank inside of the distribution transformer 1008 the at least one oil sensor 1020 can be located proximal (e.g., next to) to the oil inside of the distribution transformer 1008, such that the oil level of the oil can be detected.

In some examples, at 1044, a second set of fastener devices 1046 can be employed by passing respective shafts of the second set of fastener devices 1046 through corresponding fastener holes 1026 and 1040 in response to aligning the fastener holes 1040 with the fastener holes 1026. In some examples, the second set of fastener devices 1042 can correspond to screws. Although FIG. 10 illustrates the use of screws as the second set of fastener devices 1046 to secure the TPM device 1018 to the mounting bracket 1004, in other examples, a different securing mechanism can be used to secure the TPM device 1018 to the mounting bracket 1004.

In some examples, at 1048, a plurality of cables 1050 extending from the TPM device 1018 can be routed to respective bushings 1052 (e.g., on a low-side and/or high-side) of the distribution transformer 1008 to monitor corresponding transformer parameters. In some examples, a first set of cables of the plurality of cables 1050 can be coupled to Rogowski coils 1054 and positioned to measure a current flowing through each respective bushing 1052. In additional or alternative examples, a second set of cables of the plurality of cables 1050 corresponding to AC cables can be coupled to respective bushings 1052.

In some examples, at 1056, a pressure relief device 1058 (e.g., valve) of the distribution transformer 1008 can be removed to provide access to a pressure valve receiving port 1060 of the distribution transformer 1008. In some examples, at 1056, a pressure splitting valve 1062 (e.g., a T-shaped pressure splitting valve) can be coupled to the pressure valve receiver port 1060. A first portion of the pressure splitting valve 1062 can be coupled to the pressure valve receiver port 1060 to secure the pressure splitting valve 1062 to the distribution transformer 1008. At 1064, a pressure sensor 1066 can be secured to a second portion of the pressure split valve 1062. For example, the pressure sensor 1066 can be coupled to (e.g., twisted into) the second portion of the pressure splitting valve 1062 to secure the pressure sensor 1066 to the distribution transformer 1008. By way of further example, at 1064, a given cable 1068 of the plurality of cables 1050 of the TPM device 1018 can be secured to the pressure sensor 1066 to enable pressure sensing of the distribution transformer 1008. At 1070, the pressure relief device 1058 can be attached to a third portion of the pressure split valve 1062 to allow for relieving excessive buildup of pressure within the distribution transformer 1008.

In some examples, at 1072, a wire harness device 1074 can be routed from the TPM device 1018 to an undercarriage of the distribution transformer 1008. In some examples, the wire harness device 1074 can be similar to the wire harness device 130, as illustrated in FIG. 1 or the wire harness device 926, as illustrated in FIG. 9. The wire harness device 1074 can include a first end and a second end. The first end of the wire harness device 1074 can be connected to the TPM device 1018 to enable a controller of the TPM device 1018 (e.g., the controller 120, as illustrated in FIG. 1) to communicate with one or more sensors and/or light-emitting devices (e.g., the light-emitting device 122, as illustrated in FIG. 1) of the wire harness device 1074. In some examples, the wire harness device 1074 can include the light-emitting device 1076. In some examples, at 1072, the second end of the wire harness device 1074 can be routed along an outer surface of the distribution transformer 1008 toward the undercarriage of distribution transformer 1008, such that the light emitting device 1076 can be positioned at the undercarriage of the distribution transformer 1008 to allow for visual identification, such as by a user (e.g., personnel). The wire harness device 1074 can include along a face proximate to the outer surface of the body of the distribution transformer 1004 one of adhesive or magnetic anchors to secure the wire harness device 1074 to the body of the distribution transformer 1008.

Accordingly, the distribution transformer 1008 can be retrofitted with the TPM device 1018 without requiring replacement or extensive modification of the distribution transformer 1008 and allows for monitoring of the oil level inside the distribution transformer 1008 and in some examples a pressure inside in the oil tank.

What has been described above are examples. It is, of course, not possible to describe every conceivable combination of components or methods, as further combinations and permutations are possible. Accordingly, the disclosure is intended to embrace all such alterations, modifications, and variations that fall within the scope of this application, including the appended claims. Where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, the term "including" means including but not limited to. The term "based on" means based at least in part on.

What is claimed is:

1. A distribution transformer monitoring device comprising:

a plurality of sensors configured to monitor a plurality of operational parameters of a distribution transformer, each sensor of the plurality of sensors outputting respective sensor data, the plurality of sensors including a pressure sensor for measuring a pressure inside an oil tank of the distribution transformer and at least one of:

an oil temperature sensor for measuring a temperature of oil in the oil tank of the distribution transformer, a tank temperature sensor for measuring a temperature of the oil tank of the distribution transformer, an oil level sensor for measuring an amount of the oil in the oil tank of the distribution transformer, or a thermocouple sensor for measuring a temperature of primary side windings or secondary side windings of the distribution transformer;

a light-emitting device;

a controller configured to receive pressure sensor data from the pressure sensor and respective sensor data from each other sensor of the plurality of sensors to produce received sensor data, wherein the pressure sensor data indicates the pressure inside the oil tank of the distribution transformer and wherein the controller is further configured to:

compare the pressure inside the oil tank of the distribution transformer to a pressure threshold; and control the light-emitting device to emit light when the pressure inside the oil tank of the distribution transformer is greater than or equal to the pressure threshold; and a communications interface in communication with the controller and configured to communicate the pressure sensor data and the received sensor data to a remote system for use in determining the operational parameters of the distribution transformer.

2. The distribution transformer monitoring device of claim 1, wherein the controller includes a memory storing asset information that uniquely identifies the distribution transformer, the asset information being communicated to the remote system together with the received sensor data to enable the remote device to associate the received sensor data with the distribution transformer.

3. The distribution transformer monitoring device of claim 1, further comprising:

a global positioning system (GPS) operable to determine location information for the distribution transformer, which location information is communicated to the remote system.

4. The distribution transformer monitoring device of claim 1, further comprising:

at least one surge arrester sensor configured to monitor a surge arrester associated with the distribution transformer and output surge arrester sensor data;

wherein the controller is further configured to receive the surge arrester sensor data from the at least one surge arrester sensor and communicate the surge arrester sensor data to the remote system via the communication interface to enable the remote system to determine an amount of deterioration of the surge arrester.

5. A distribution transformer system comprising:

a plurality of distribution transformers; and a plurality of distribution transformer monitoring devices secured to the plurality of distribution transformers on a one-to-one basis such that a distribution transformer monitoring device of the plurality of distribution transformer monitoring devices is secured to each distribution transformer of the plurality of distribution transformers, wherein each distribution transformer monitoring device of the plurality of distribution transformer monitoring devices includes:

a plurality of sensors configured to monitor a plurality of physical properties of the distribution transformer to which the distribution transformer monitoring device is secured, each sensor of the plurality of sensors outputting respective sensor data representative of at least one monitored physical property of the plurality of physical properties;

a controller configured to receive the respective sensor data from each sensor of the plurality of sensors to produce received sensor data; and a communications interface in communication with the controller and configured to communicate the received sensor data to a remote system for use in determining operational parameters of the distribution transformer.

6. The distribution transformer system of claim 5, wherein the plurality of distribution transformers includes at least one of pole-type distribution transformers, pad-mounted type distribution transformers, or vault type distribution transformers.

7. The distribution transformer system of claim 5, wherein the controller includes a memory storing asset information that uniquely identifies the distribution transformer, the asset information being communicated to the remote system together with the received sensor data to enable the remote device to associate the received sensor data with the distribution transformer.

8. The distribution transformer system of claim 5, wherein each distribution transformer monitoring device further includes:

a global positioning system (GPS) operable to determine location information for the distribution transformer to which the distribution transformer monitoring device is secured, which location information is communicated to the remote system.

9. The distribution transformer system of claim 5, further comprising:

a plurality of surge arresters, wherein each surge arrester of the plurality of surge arresters is associated with a respective distribution transformer of the plurality of distribution transformers;

wherein each distribution transformer monitoring device further includes:

at least one surge arrester sensor configured to monitor a surge arrester associated with the distribution transformer to which the distribution transformer monitoring device is secured and output surge arrester sensor data;

wherein the controller is further configured to receive the surge arrester sensor data from the at least one surge arrester sensor and communicate the surge arrester sensor data to the remote system via the communication interface to enable the remote system to determine an amount of deterioration of the surge arrester.

10. The distribution transformer system of claim 5, wherein each distribution transformer monitoring device further includes a light-emitting device, wherein the plurality of sensors includes at least a pressure sensor for measuring a pressure inside the oil tank of the distribution transformer to which the distribution transformer monitoring device is secured, and wherein the controller is further configured to:

receive pressure sensor data from the pressure sensor, the pressure sensor data indicating the pressure inside the oil tank of the distribution transformer;

compare the pressure inside the oil tank of the distribution transformer to a pressure threshold; and control the light-emitting device to emit light when the pressure inside the oil tank of the distribution transformer is greater than or equal to the pressure threshold.

11. The distribution transformer system of claim 5, wherein the plurality of sensors includes:

(i) at least one of:

a voltage sensor for measuring an amount of voltage at a low voltage connection of the distribution transformer, or a current sensor for measuring an amount of current flowing through the low voltage connection of the distribution transformer, and (ii) at least one of:

an oil temperature sensor for measuring a temperature of oil in an oil tank of the distribution transformer, a tank temperature sensor for measuring a temperature of the oil tank of the distribution transformer, an oil level sensor for measuring an amount of the oil in the oil tank of the distribution transformer, a pressure sensor for measuring a pressure inside the oil tank of the distribution transformer, or a thermocouple sensor for measuring a temperature of primary side windings or secondary side windings of the distribution transformer.

\* \* \* \* \*